US006605812B1

(12) United States Patent
Yeh et al.

(10) Patent No.: US 6,605,812 B1
(45) Date of Patent: Aug. 12, 2003

(54) METHOD REDUCING THE EFFECTS OF $N_2$ GAS CONTAMINATION IN AN ION IMPLANTER

(75) Inventors: Su-Yu Yeh, Taipei (TW); Chi-Bing Chen, Pingtung (TW); Cheng-Yi Huang, Hsin-Chu (TW); Chao-Jie Tsai, Hsin-Chu (TW); Lu-Chang Chen, Hsinchu (TW); Hsing-Jui Lee, I-Lan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/080,430

(22) Filed: Feb. 22, 2002

(51) Int. Cl.[7] .................................................. H01J 37/08

(52) U.S. Cl. .............................. 250/423 R; 250/492.21

(58) Field of Search ......................... 250/423 R, 492.21

(56) References Cited

U.S. PATENT DOCUMENTS 5,861,630 A * 1/1999 Becker ................... 250/423 R

* cited by examiner

*Primary Examiner*—Kiet T. Nguyen

(74) *Attorney, Agent, or Firm*—Tung & Associates

(57) ABSTRACT

A method for reducing a dinitrogen ($N_2$) ion concentration in an ion implanter including providing an ion implanter having an ion source chamber for producing source ions said ion source chamber surrounded by a plurality of source magnets having a current supply for altering a position of said source ions; providing a gaseous source of material to the ion source chamber for ionization thereby creating a supply of source ions for implantation; creating a supply of source ions to include dinitrogen ($N_2$) ions and nitrogen (N) ions supplied for implantation; and, increasing a current supply to at least one of the plurality of source magnets such that a ratio of dinitrogen ($N_2$) ions to nitrogen (N) ions supplied for implantation is reduced.

20 Claims, 2 Drawing Sheets

METHOD REDUCING THE EFFECTS OF $N_2$ GAS CONTAMINATION IN AN ION IMPLANTER

FIELD OF THE INVENTION

This invention generally relates ion implanters and more particularly to a method for reducing the undesirable effects of $N_2$ ion source contamination in an ion implanter during Silicon ion implants.

BACKGROUND OF THE INVENTION

Ion beam implanters are used to implant or "dope" silicon wafers with impurities to produce n or p type doped regions on the wafers. The n and p type material regions are utilized in the production of semiconductor integrated circuits. Implanting ions generated from source materials such as antimony, arsenic or phosphorus results in n type material. If p type material is desired, ions generated with source materials such as boron, gallium or indium are typically used.

The ion beam implanter includes an ion source for generating positively charged ions from ionizable source materials. The generated ions are formed into a beam and accelerated along a predetermined beam path to an implantation station. The beam is formed and shaped by apparatus located along the beam path en route to the implantation station. When operating the implanter, the interior region must be evacuated to reduce the probability of ions being deflected from the predetermined beam path as a result of collisions with air molecules.

During ion implantation a surface is uniformly irradiated by a beam of ions or molecules, of a specific species and prescribed energy. The size of the wafer or substrate (e.g. 8 inches or greater) is typically much larger than the cross-section of the irradiating beam which deposits on the wafer as a spot or "ribbon" of about 1 inch. Commonly, in high current machines, the required uniform irradiance is achieved by moving the wafer through the beam.

Operation of an ion implanter results in the production of certain contaminant materials. These contaminant materials adhere to surfaces of the implanter including beam forming and shaping structures adjacent the ion beam path and also on the surface of the wafer support facing the ion beam. Contaminant materials also include undesirable species of ions generated in the ion source, that is, ions having the either the wrong atomic mass or undesired ions of with the same atomic mass as a desired ion.

In a conventional ion implanter, an ion beam is emitted from an ion source and passed through a pre-analyzing magnet to remove undesired types of ions. Ions having identical energies but different masses experience a different magnetic force as they pass through the magnetic field due to their differing masses thereby altering their pathways. As a result, only those desired ions of a particular atomic mass unit (AMU) are allowed to pass through a prepositioned orifice in the pre-analyzing magnet.

After passing through the pre-analyzing magnet the ion beam is accelerated to a desired energy by an accelerator. Negative ions are changed into positive ions by a charge exchange process involving collisions with a chemically inert gas such as Argon. The positive ions then pass through a post-analyzing magnet and finally reach a wafer where they impact the wafer and are implanted.

Ion implantation has the ability to precisely control the number of implanted dopant atoms into substrates to within 3%. For dopant control in the $10^{14}$–$10^{18}$ atoms/$cm^3$ range, ion implantation is generally superior to chemical diffusion techniques. The implantation may be performed through materials that may already be in place while other materials may be used as masks to create specific doping profiles. Furthermore, more than one type of dopant may be implanted at the same time and at the same position on the wafer. Other advantages include the fact that ion implantation may be performed at low temperature which does not harm photoresist and in high vacuum which provides a clean environment.

With respect to impurities generated in an ion implanter, among the most troublesome are those where the product of the mass M and the energy E is the same as that of the desired species in the ion beam. In such cases, since the impurities have the same radius of curvature as the desired ion beams, they are likely to pass through both the pre-analyzing and the post-analyzing magnet and reach the wafer.

In such cases there is frequently no way to remove impurities before they reach the wafer. The passage of even a small amount of impurities can have substantial degrading effects on the electrical characteristics of the wafer. For example, in the manufacture of gate oxide films, even if only a very small amount of undesired impurities reach the wafer the quality of a gate oxide film is degraded and in subsequent processing may cause the gate oxide film to grow to an undesired thickness. As a result, semiconductor device reliability is reduced.

One particularly troublesome impurity is $N_2$, especially when carrying out an ion implantation process with silicon ions. For example, silicon implanting is used in silicidation processes forming e.g., $TiSi_x$ in connection with gate structure formation and pre-amorphous implanting of silicon into polysilicon to alter its crystallization behavior, are a few of the many semiconductor formation processes using silicon ion implantation. Since silicon and $N_2$ ions have the same atomic mass unit (AMU) of 28 they are not differently affected or distinguished when passing through the pre-analyzing or the post-analyzing magnet. As a result, both species are passed through to the wafer where the $N_2$ adversely affecting silicon implantation. Device electrical characteristics are typically extremely sensitive to implant concentrations making implant stability and repeatability of the utmost importance in quality control considerations.

One example where the presence of the impurity $N_2$ can undesirably affect the performance of an ion implanter is in the calibration of the ion implanter by the use of a metrology instrument known as a thermawave tool to detect ion implantation damage in the target material. Generally, a measured dose of an implanted test species (measured by monitoring a physical property change in the implanted material) is compared with a previously recorded dose to determine the calibration state of the ion implanter. Consistency between test ion implantations with low mass ions may be used to provide information about the proper operation of the ion implanter. Silicon is frequently used as a test species that is implanted, causing measurable implantation damage which is subsequently measured by a thermawave tool. Generally, the thermawave tool measures a change in the surface reflectivity of the target material which corresponds to a known dose of implanted species. Comparing a present dose to a previously recorded dose indicates whether the ion implanter is performing properly within specifications. Clearly, where the impurity $N_2$ reaches the wafer together with silicon ions in a calibration state test procedure, the calibration state will be altered resulting in faulty information concerning the operation of the ion implanter. For example, the thermawave results may erroneously indicate that the ion implanter is operating within specifications resulting in an under dosage of implanted silicon. Furthermore, an unpredictable source of contamination leads to instability and irreproducibility between different implanting procedures.

FIG. 1, for example, shows a typical plot of implant monitoring results to assess the concentration of implanted ions following an ion implantation procedure performed under substantially identical conditions. The vertical axis is a measure of implant concentration and the horizontal axis represents time over a time period of several ion implantations. The upper and lower lines A and B respectively, indicate the window of acceptable variation of ion implantation concentrations for the implantation procedure. It can be seen that the monitor measurements indicated by data line C have a high degree of variability and are poorly reproducible, frequently being out of specification, e.g., above line A or below line B.

One source of $N_2$ contamination is atmospheric leakage into the vacuum environment of the implanter including the ion source chamber. The ion source chamber generally operates by using electrons generated in a plasma discharge to impact neutral gaseous source species thereby forming source ions which are accelerated along a beam line to impact the target, for example a semiconductor wafer. Although $N_2$ may decompose into $N_2^+$ and $N^+$ in the ion source chamber, the presence of $N_2^+$ having the same AMU (28) as $Si^+$ thereby contaminates the ion implantation beam ultimately leading to wafer contamination in the case where silicon is used as an implanting ion. Although the presence of a leak in the beam line may be indicated by a pressure change, the degree of corresponding change in the silicon implant calibration cannot be predictably quantified due to a margin of measurement error attributable to differences between various implanters.

There is therefore a need in the semiconductor processing art to reduce the undesirable effects of $N_2$ contamination in ion implanting operations, especially in the case where silicon is used as an implanting ion.

It is therefore an object of the invention to present a method whereby the undesirable effects of $N_2$ contamination are reduced in ion implantation operations, especially in the case where silicon is used as an implanting ion, while overcoming other shortcomings of the prior art.

SUMMARY OF THE INVENTION

To achieve the foregoing and other objects, and in accordance with the purposes of the present invention, as embodied and broadly described herein, the present invention provides a method for reducing a dinitrogen ($N_2$) ion concentration included in source ions for implantation.

In a first embodiment, the method includes providing an ion implanter having an ion source chamber for producing source ions said ion source chamber surrounded by a plurality of source magnets having a current supply for altering a position of said source ions; providing a gaseous source of material to the ion source chamber for ionization thereby creating a supply of source ions for implantation; creating a supply of source ions to include dinitrogen ($N_2$) ions and nitrogen (N) ions supplied for implantation; and, increasing a current supply to at least one of the plurality of source magnets such that a ratio of dinitrogen ($N_2$) ions to nitrogen (N) ions supplied for implantation is reduced.

In related embodiments, silicon ions are included in the supply of source ions. Further, the method includes the step of determining a concentration of dinitrogen ($N_2$) ions and nitrogen (N) ions present in the ions supplied for implantation prior to including silicon ions in the supply of source ions.

In other related embodiments, the step of creating a supply of source ions is carried out according to a plasma discharge process. Further, the steps of providing a gaseous source and creating a supply are carried out in an arc chamber including at least one filament.

In other related embodiments, the current supply is increased to at least about 25 Amperes. Further, the current supply is increased to at least about 30 Amperes.

In yet other related embodiments, the ratio is reduced to less than a value of about 1.0. Further, the ratio is reduced by a factor of at least about 2.

In another embodiment, the ratio is reduced such that an implant concentration variation between ion implant procedures is within predetermined limits.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
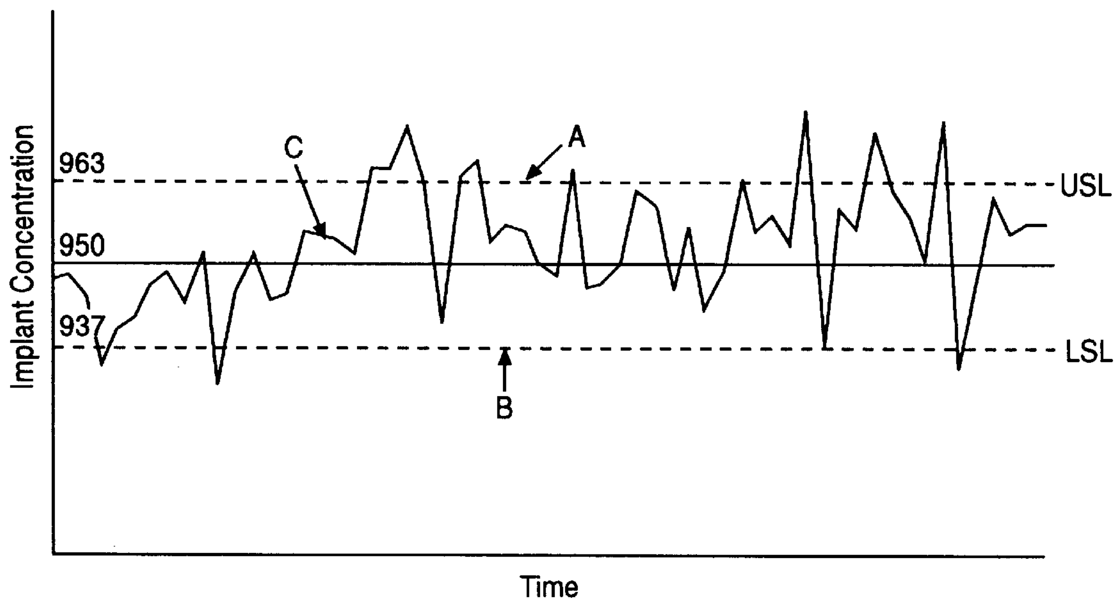
FIG. 1 is data showing ion implant concentrations versus time for a series of ion implantations under identical conditions according to the prior art.
Figure 2:
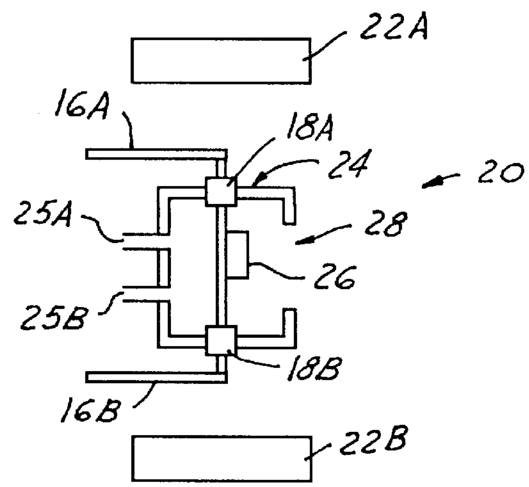
FIG. 2 is a schematic cross sectional side view representation of a source ion chamber used according to the method of the present invention.

Referring to FIG. 2, is shown an ion source chamber 20 having source magnets (electromagnets) 22A and 22B disposed surrounding an arc chamber 24 into which an ionizable material is fed through either vaporizer inlet 25A or gas feed inlet 25B. Filament 26 is supplied by electrical power feeds 16A and 16B entering arch chamber 24 through insulating standoffs 18A and 18B. Generally, in operation, a source gas is introduced into the ion source chamber at a pressure of about $10^{-3}$ Torr whereby filament 26 produces a source of electrons and source gas ions according to a plasma discharge between the filament and arc chamber 24. The electrons and source gas ions are then guided along magnetic field lines (not shown) supplied by source magnets 22A and 22B to further impact ionizable source gas producing a supply of source ions which are then electrostatically extracted from the plasma and accelerated through an aperture 28 in the extraction electrode wall to enter the implanter beam line. Source magnets 22A and 22B generally operate to guide emitted electrons along magnetic filed lines thereby impacting source gas molecules to create source ions for implantation.

According to the present invention, it has been unexpectedly found that increasing the current supplied to the source magnets 22A and 22B. It is believed that increasing the current supplied to the source magnets increases the magnetic field strength thereby increasing the probability of electrons produced from the plasma discharge colliding with ion source gas including a secondary electron impact to decompose $N_2^+$ into $N^+$. As a result the ratio of $N_2^+$ to $N^+$ is decreased thereby reducing the contamination level of $N_2^+$ in the beam line. As related in the background, $N_2^+$ cannot be separated from $Si^+$ due to identical AMU (28) values thereby resulting in erroneous implantation calibration levels and instabilities in ion implanter results from one ion implant to another.

Figure 3:
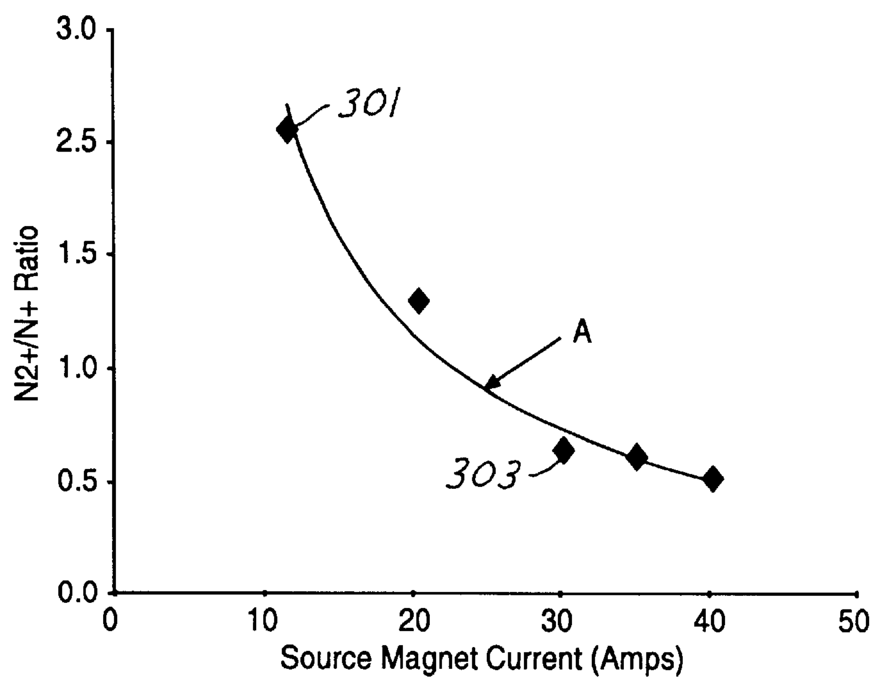
FIG. 3 is data showing a nitrogen ion impurity ratio versus source magnet current according to the method of the present invention.

For example, referring to FIG. 3 is shown one embodiment of the present invention in exemplary operation where the $N_2^+$ contamination level is reduced by increasing the source magnet current to the source magnets. In FIG. 3, the vertical axis represents the ratio of $N_2^+$ to $N^+$ ions while the horizontal axis represents the source magnet current in Amperes (Amps). In FIG. 3 one can see that increasing the current to the source magnets can be correlated with a decrease in the $N_2^+$/N+ ratio according to data line A. Whereas, according to the prior art the source current magnets typically operated at about 13 Amps at indicated at 301, according to the present invention, the source magnet current is preferably operated at least at about 30 Amps as indicated at 303. It will be appreciated that the particular source magnet operating current level will depend upon several factors including the normal operating parameters for a particular ion implanter. According to the present invention, increasing the source magnet current by at least a factor of about 2 under otherwise normal operating parameters for a particular ion implanter including source gas feed rates, discharge arc control parameters (voltage and current) and beam current parameters, should be sufficient in most cases to decrease the $N_2^+$ contamination levels to preferable values.

For example, it will be appreciated that the data reflected in FIG. 3 is according to a particular ion implanter such as an Applied Materials, Inc. Implanter Model 9500xR™ and the particular behavior of the $N_2^+/N^+$ ratio with magnet current may vary somewhat depending on the ion implanter model characteristics including, for example, the characteristics of the plasma discharge, the source gas pressures, and the positioning and characteristics of the source magnets.

Figure 4:
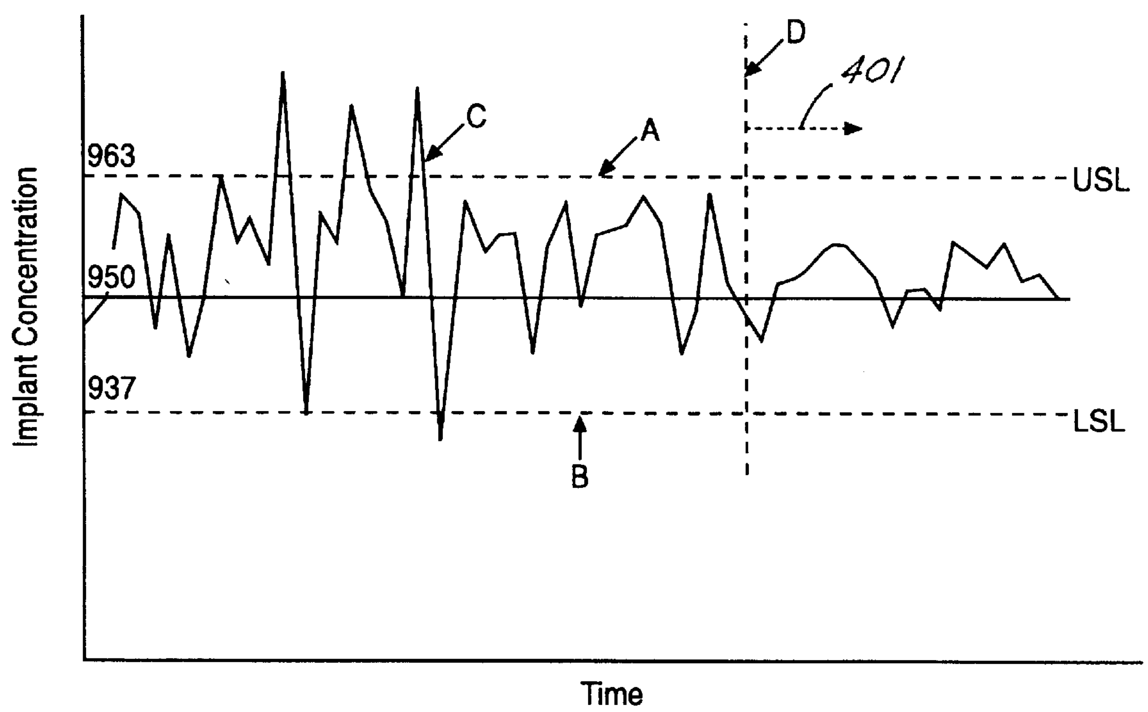
FIG. 4 is data showing ion implant concentrations versus time for a series of ion implantations under identical conditions according to the method of the present invention contrasted with the prior art.

As an example of the improved operation of an ion implanter according to the present invention, FIG. 4 shows a series of data points that represent thermawave measurements taken over a period of several days. The horizontal axis represents time with the time between data points being about 12 hours. The vertical axis is a representation of the ion implant concentration as determined under identical ion implant conditions. As previously explained in the background, the ion implanter is calibrated with an ion implant monitor to get a measure of the implant ion concentration. A subsequent ion implant concentration is approximated in subsequent ion implanter operations according to a thermawave measurement (surface reflectivity) based on a previous ion implant monitor calibration.

Shown in FIG. 4, are the lines A and B which represent the upper and lower limits respectively, of an acceptable window of allowable deviation of determined ion implant concentrations, the window determined from previous implant calibration for silicon ions. As shown in the data line C, ion implantations up to the time period represented by vertical line D has a wide degree of variation from one ion implant to another according to calibrated thermawave measurements. Prior to the time indicated at line D, the ion implanter was operated according to operating parameters of the prior art including a source magnet current of about 13 Amps. After the time indicated at line D as indicated by directional arrow 401, the ion implanter is operated with a source magnet current of about 30 Amps with other operating parameters remaining about the same. As shown in the data e.g., 403, in ion implantations after line D, the variation in implant concentration is significantly reduced, thereby increasing an effective margin of allowable implant variation from other causes. Thus, the implant concentration variations due to nitrogen ion impurities are reduced thereby increasing the stability of ion implant concentrations.

Thus, according to the present invention, a method has been presented to reduce the variation in ion implant stability due to source gas contamination. As a result, ion implantations will be more consistent, reliable and predictable thereby increasing the quality and yield of semiconductor implant processes.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing a dinitrogen ($N_2$) ion concentration included in source ions for implantation comprising the steps of:

providing an ion implanter having an ion source chamber for producing source ions said ion source chamber surrounded by a plurality of source magnets having a current supply for altering a position of said source ions;

providing a gaseous source of material to the ion source chamber for ionization thereby creating a supply of source ions for implantation;

creating a supply of source ions to include dinitrogen ($N_2$) ions and nitrogen (N) ions supplied for implantation; and increasing a current supply to at least one of the plurality of source magnets such that a ratio of dinitrogen ($N_2$) ions to nitrogen (N) ions supplied for implantation is reduced.

2. The method of claim 1, wherein silicon ions are included in the supply of source ions.

3. The method of claim 2, further comprising the step of determining a concentration of dinitrogen (N2) ions and nitrogen (N) ions present in the ions supplied for implantation prior to including silicon ions in the supply of source ions.

4. The method of claim 1, wherein the step of creating a supply of source ions is carried out according to a plasma discharge process.

5. The method of claim 1, wherein the steps of providing a gaseous source and creating a supply are carried out in an arc chamber including at least one filament.

6. The method of claim 1, wherein the current supply is increased to at least about 25 Amperes.

7. The method of claim 1, wherein the current supply is increased to at least about 30 Amperes.

8. The method of claim 1, wherein the ratio is reduced to less than a value of about 1.0.

9. The method of claim 1, wherein the ratio is reduced by a factor of at least about 2.

10. The method of claim 1, wherein the ratio is reduced such that an implant concentration variation between ion implant procedures is within predetermined limits.

11. A method for reducing dinitrogen ($N_2$) ion contamination in an ion implantation beam comprising the steps of:

providing a gaseous source of material including silicon to be ionized thereby creating source ions for forming into an ion implantation beam for implanting into a target material;

creating a supply of source ions to including dinitrogen ($N_2$) and nitrogen (N) ions;

providing a magnetic field for guiding a flow pathway for said source ions; and increasing the magnetic field strength to an operating level such that a ratio of dinitrogen ($N_2$) ions to nitrogen (N) ions present in the supply of source ions is reduced.

12. The method of claim 1, wherein the step of creating a supply of ions is carried out according to a plasma discharge process.

13. The method of claim 12, wherein the steps of providing a gaseous source and creating a supply are carried out in an arc chamber including at least one filament.

14. The method of claim 11, wherein the step of providing a magnetic field includes positioning at least one source electromagnet in proximity to a source of the source ions.

15. The method of claim 14, wherein the magnetic field strength is increased by increasing a current supply to the at least one electromagnet.

16. The method of claim 15, wherein the current supply is increased to at least about 25 Amperes.

17. The method of claim 15, wherein the current supply is increased to at least about 30 Amperes.

18. The method of claim 11, wherein the ratio is reduced to less than a value of about 1.0.

19. The method of claim 11, wherein the ratio is reduced by a factor of at least about 2.

20. The method of claim 11, wherein the ratio is reduced such that an implant concentration variation between ion implant procedures is within predetermined limits.

* * * * *